United States Patent [19]

Akagawa

[11] Patent Number: 5,259,719
[45] Date of Patent: Nov. 9, 1993

[54] APPARATUS FOR TRANSFERRING DISKS BETWEEN A CASSETTE AND A PALLET

[75] Inventor: Minoru Akagawa, Fremont, Calif.

[73] Assignee: Intelmatec Corporation, Fremont, Calif.

[21] Appl. No.: 815,938

[22] Filed: Dec. 30, 1991

[51] Int. Cl.$^5$ ............................................. B65G 65/34
[52] U.S. Cl. ................................... 414/416; 414/908; 414/27; 294/119.1
[58] Field of Search ................. 414/27, 403, 404, 416, 414/908; 294/119.1, 103.1, 67.22

[56] References Cited

U.S. PATENT DOCUMENTS

| | | | |
|---|---|---|---|
| 3,655,232 | 4/1972 | Martelee | 294/119.1 X |
| 4,290,734 | 9/1981 | Van Breen | 414/787 X |
| 4,645,401 | 2/1987 | Hopkins et al. | 414/908 X |
| 4,659,281 | 4/1987 | Aupperle | 414/908 X |
| 4,852,928 | 8/1989 | Monforte | 294/119.1 X |
| 4,865,509 | 9/1989 | Carlton | 414/908 X |
| 4,957,406 | 9/1990 | Akagawa | 414/908 X |
| 4,976,484 | 12/1990 | Nomaru et al. | 294/119.1 |
| 4,998,857 | 3/1991 | Paravella et al. | 414/908 X |
| 4,998,987 | 3/1991 | Jacobs | 414/908 X |
| 5,017,075 | 5/1991 | Block | 294/119.1 X |

FOREIGN PATENT DOCUMENTS 1141181  2/1985  U.S.S.R. ............... 294/119.1

*Primary Examiner*—Frank E. Werner
*Assistant Examiner*—James T. Eller, Jr.
*Attorney, Agent, or Firm*—Heller, Ehrman, White & McAuliffe

[57] ABSTRACT

An apparatus for transferring disks with central holes such as wafers includes two transversely notched horizontal rods which are supported parallel to each other and one above the other. The lower rod is adapted to be passed through the center holes of the disks and to support them in its notches by their inner peripheries. The upper rod serves to securely hold these disks from above by their outer rims. A driving unit is provided to individually move the two rods longitudinally and also to vary the separation between them. The apparatus, as a whole, can be moved robotically in all directions. With the apparatus thus structured, the disks can be transferred sequentially between a cassette of an ordinary type for holding them vertically and parallel to one another at a uniform pitch with their central holes aligned and a pallet having a vertical surface with openings each capable of supporting a disk with its both surfaces exposed for processing.

4 Claims, 6 Drawing Sheets

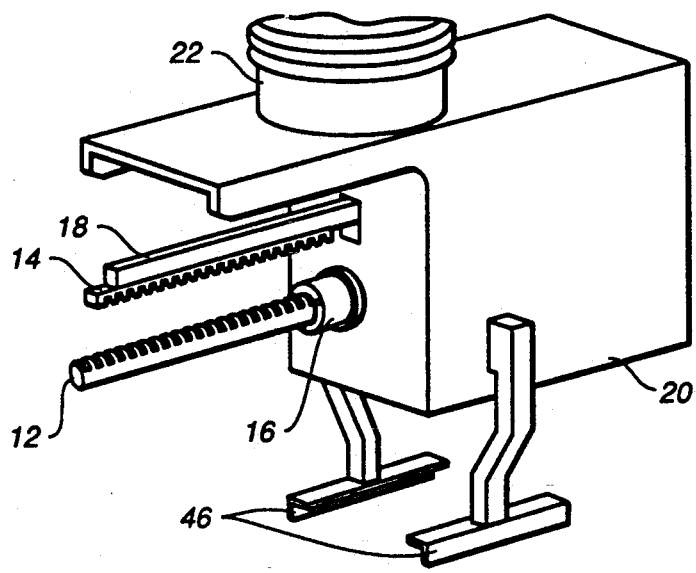
FIG._1
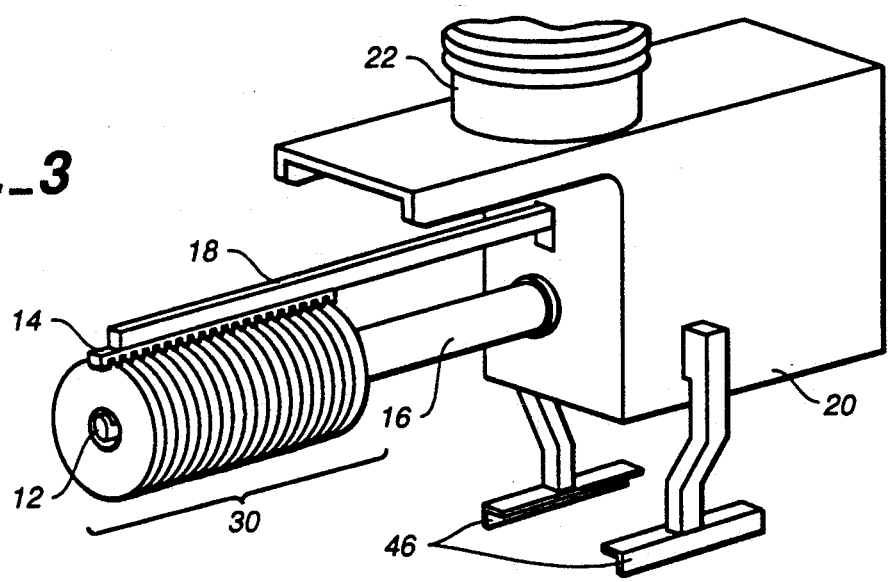
FIG._3
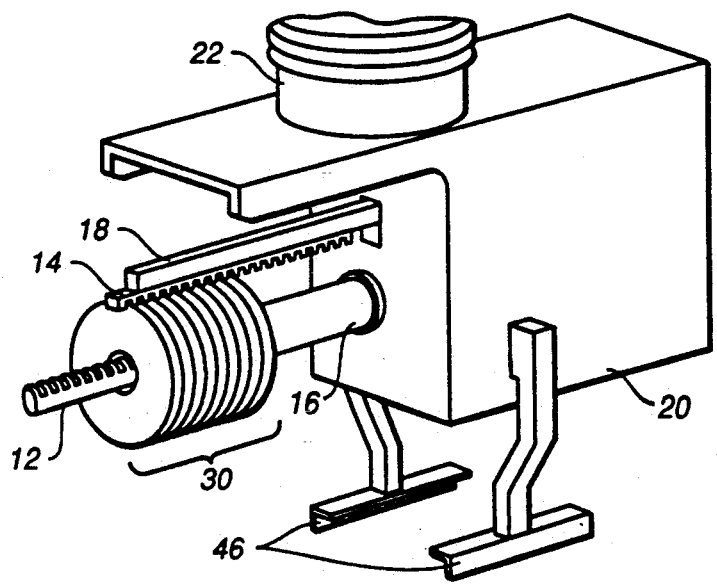
FIG._5

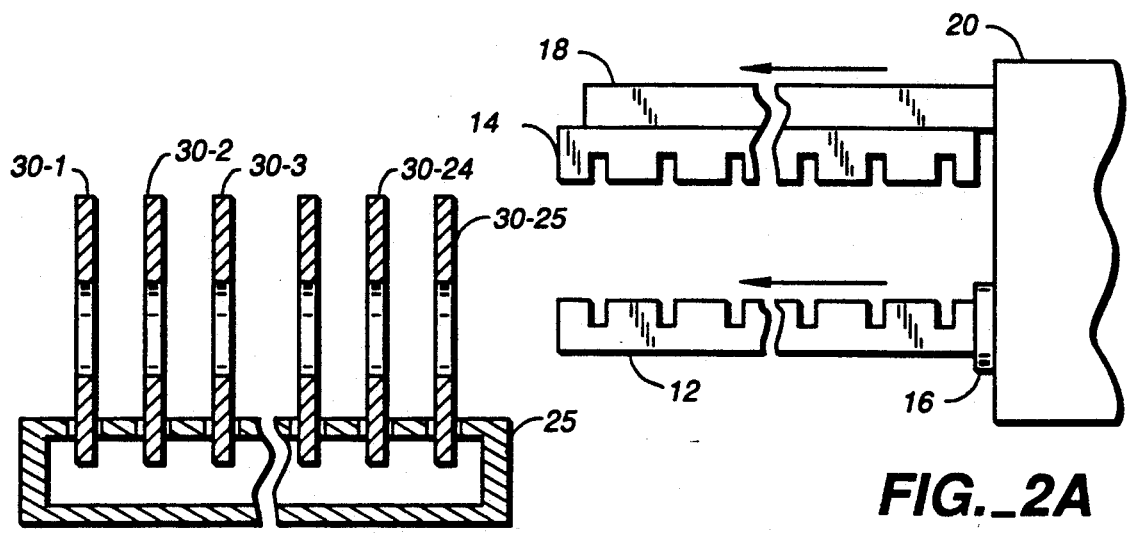
FIG._2A
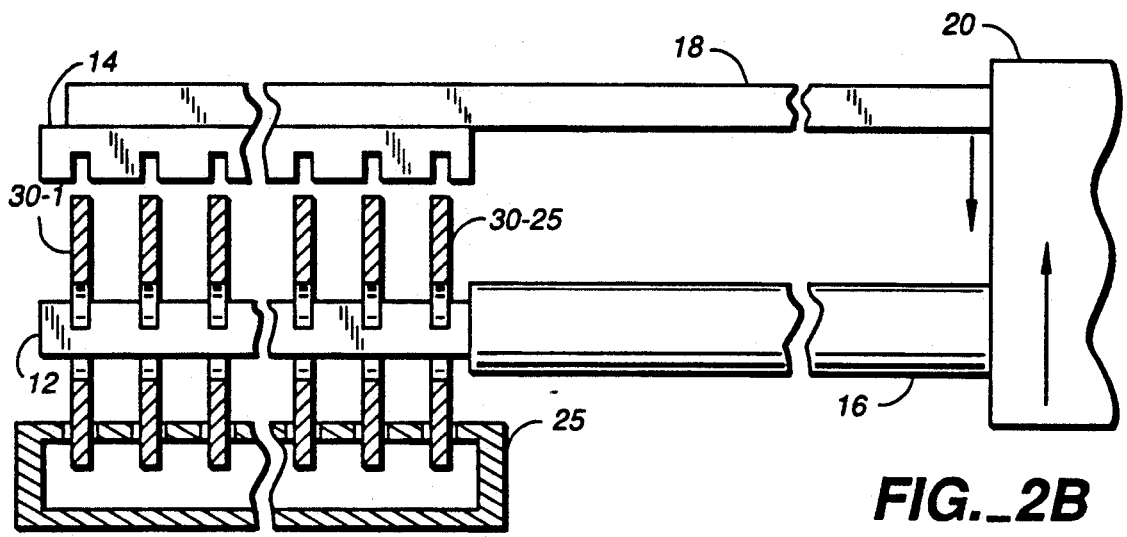
FIG._2B
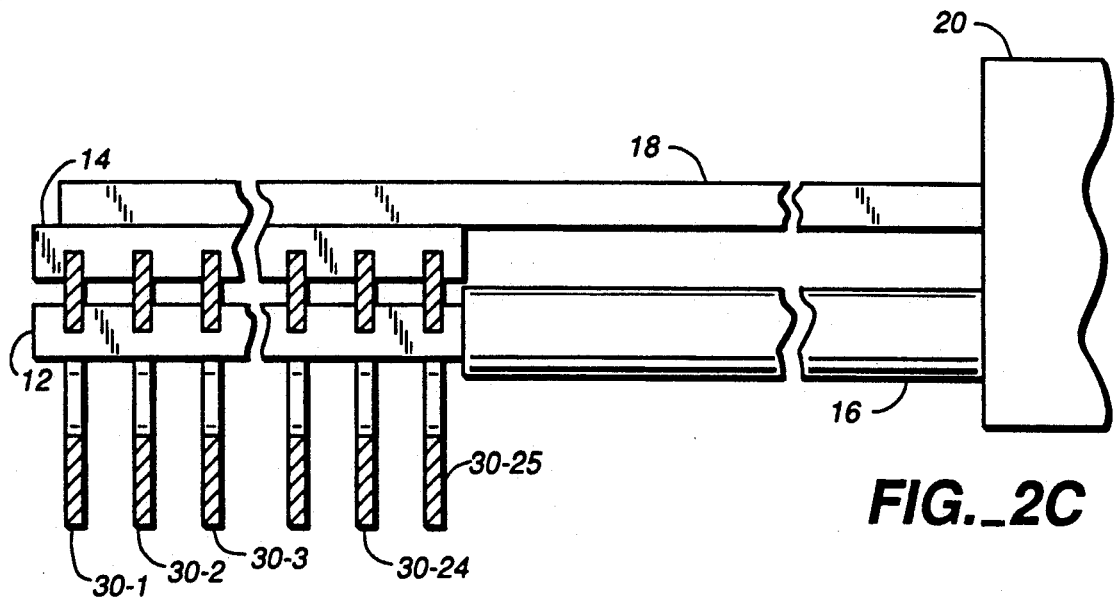
FIG._2C

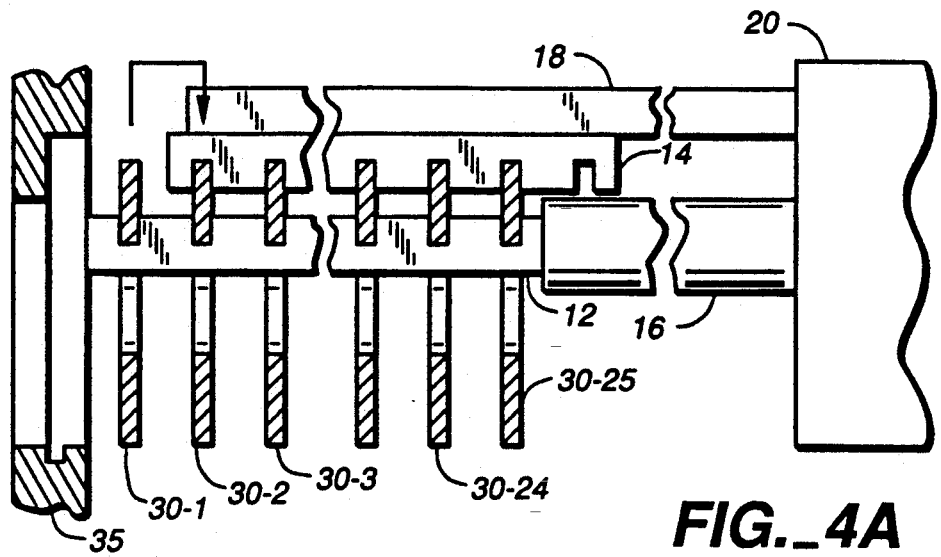
FIG._4A
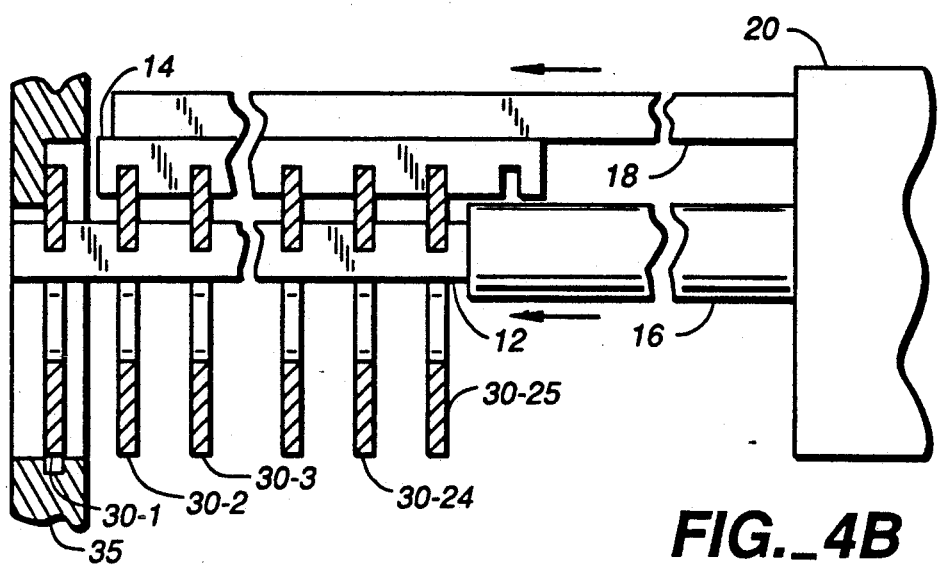
FIG._4B
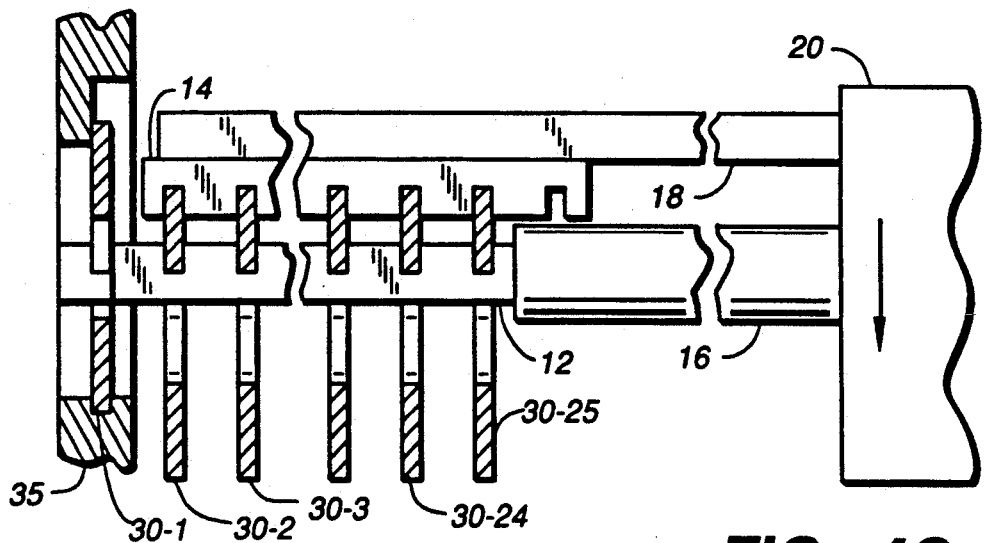
FIG._4C

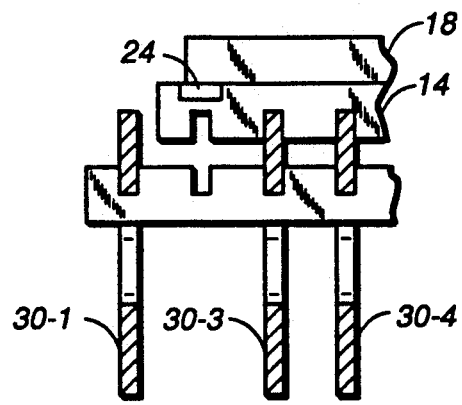
FIG._6
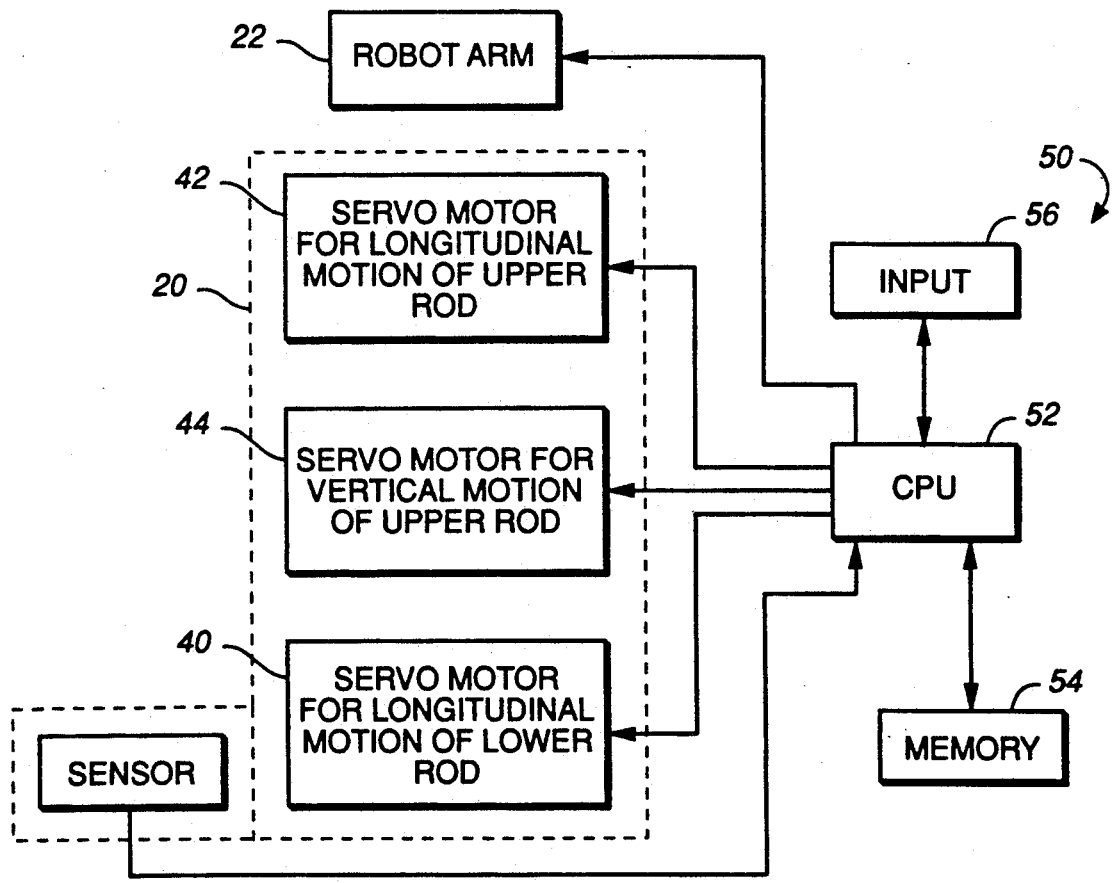
FIG._8

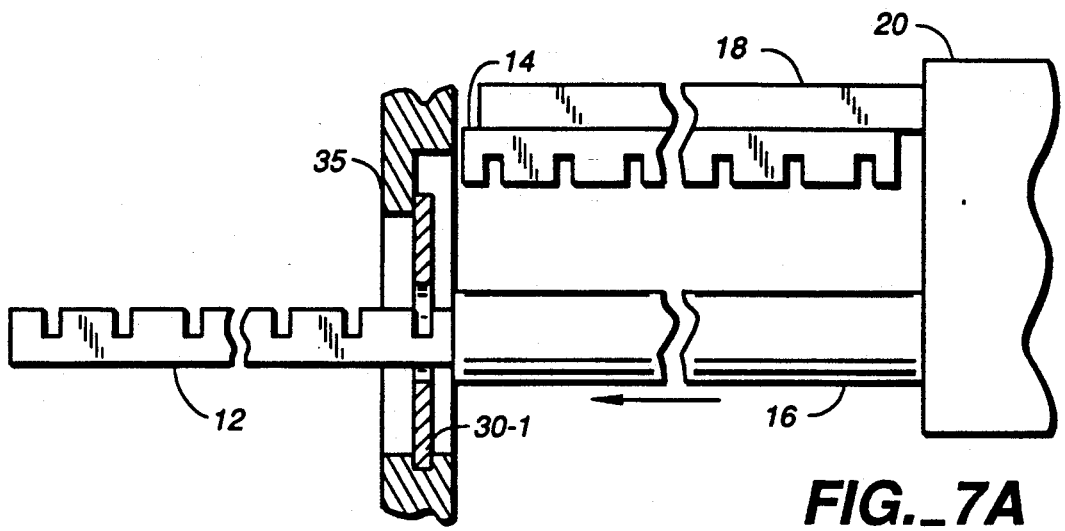
FIG._7A
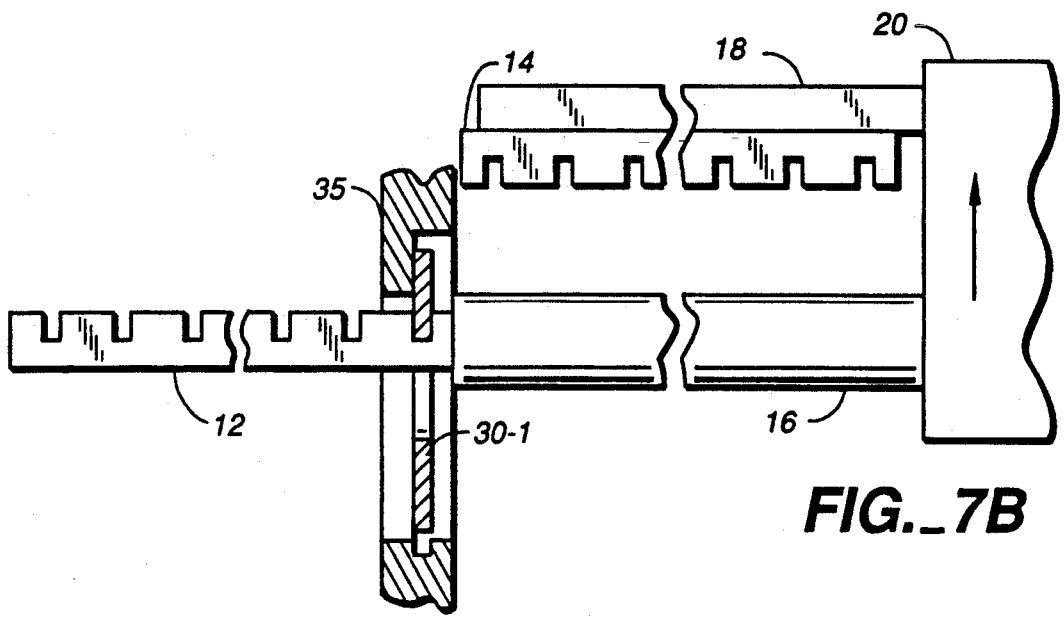
FIG._7B
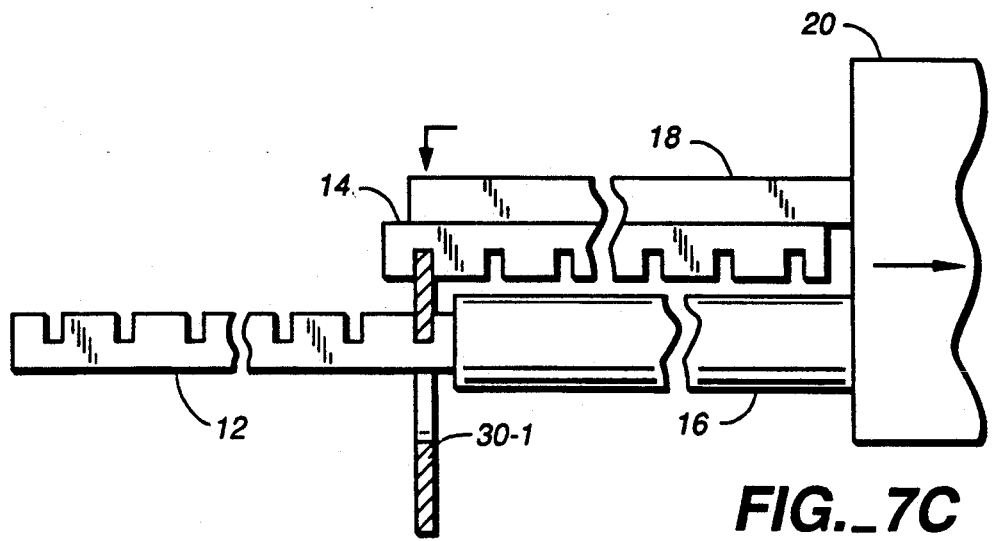
FIG._7C

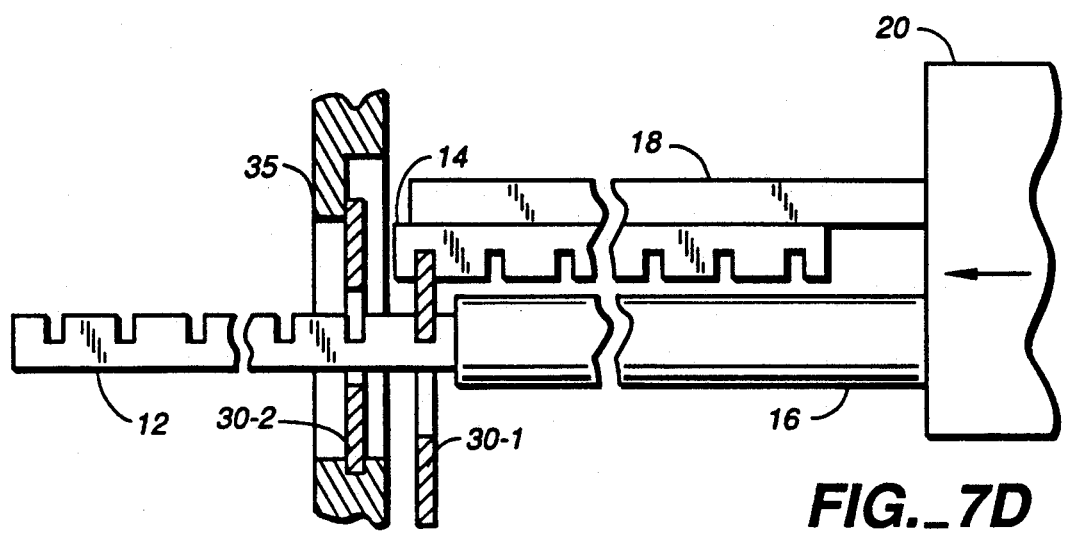
FIG._7D
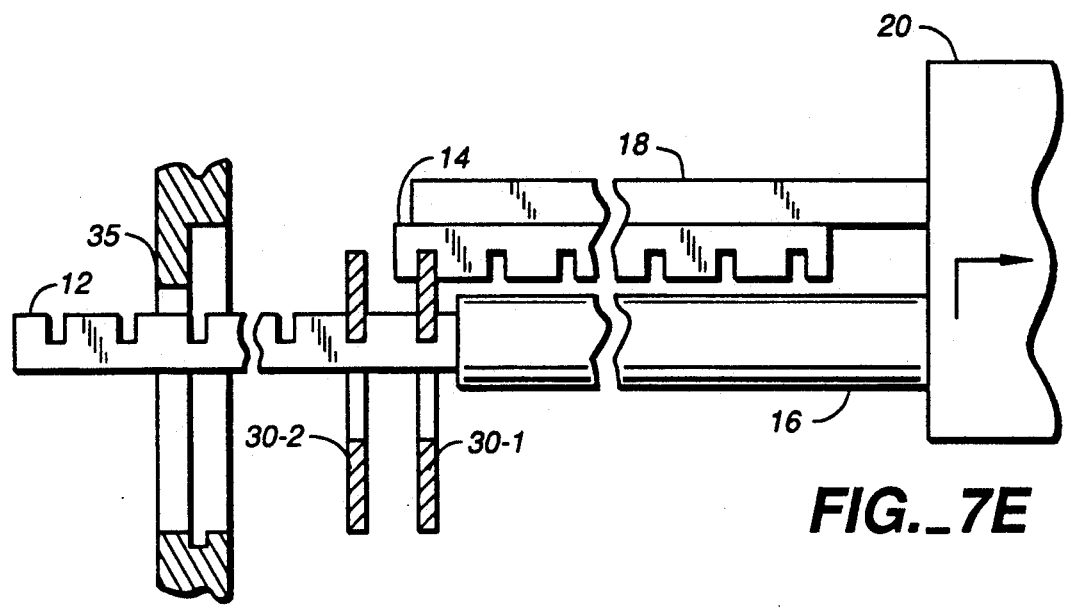
FIG._7E
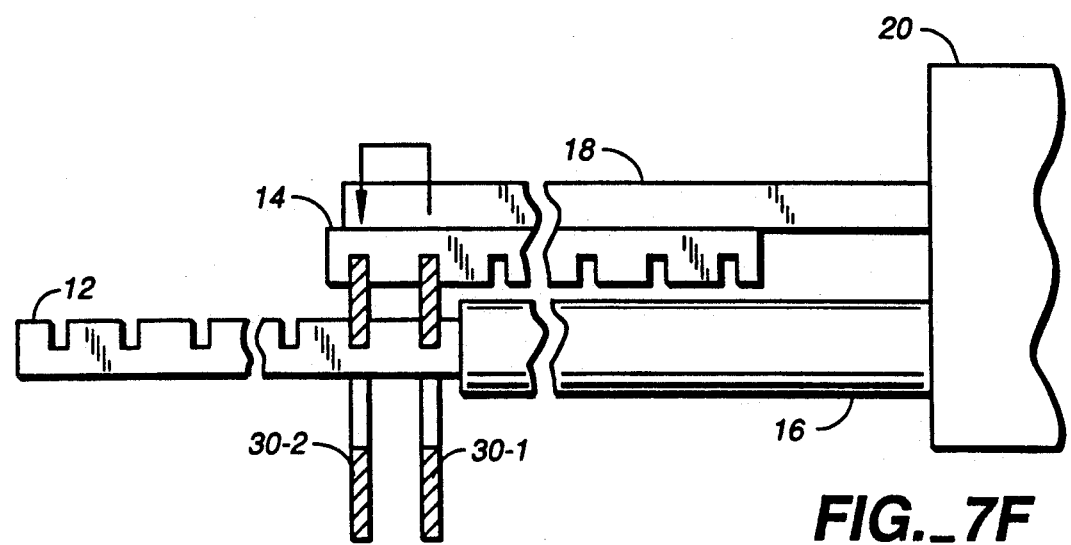
FIG._7F

APPARATUS FOR TRANSFERRING DISKS BETWEEN A CASSETTE AND A PALLET

BACKGROUND OF THE INVENTION

This invention relates to an apparatus for transferring disks such as semiconductor wafers between a cassette of a conventional type and a pallet for holding them vertically with both their surfaces exposed for processing. More particularly, this invention relates to such an apparatus for disks with a small central hole.

Semiconductor wafers are fragile and are easily rendered useless by contamination or abrasion. For this reason, they are usually carried in a cassette when they are transported from one work station to another for processing. A cassette used for such a purpose is shaped generally like a box or a cage having walls with grooves at a uniform pitch. A plurality of (typically 25) disks are carried in one of such cassettes, maintained vertically and parallel to one another with their central holes aligned. Cassettes of this type have been described, for example, in U.S. Pat. Nos. 4,311,427, 4,471,716, 4,493,418 and 4,743,159.

Although the disks may be kept in such a cassette for some kinds of processing, they are often required to be transferred onto what is frequently referred to as a pallet, which is a planar disk holder having a plurality of circular holes with grooves such that the disks can be supported vertically thereat with both surfaces substantially entirely exposed. Such a disk holding device has been described, for example, in U.S Pat. Nos. 4,595,481, 4,634,512 and 4,880,518, and a disk gripper for gripping disks by the peripheries of their central holes for robotically transferring them sequentially between a cassette and a pallet has been described, for example, in U.S. Pat. No. 4,957,406.

Modern progress in technology has made it possible to reduce the size of the central hole of wafers. Nowadays, semiconductor wafers with central holes with diameter as small as about 8 mm are not uncommon. With central holes of the disks thus reduced in size, disk grippers of the type having a rod with devices thereon for gripping the inner peripheries of the disks are not practical because such devices for securely grabbing the disks cannot be made very small.

SUMMARY OF THE INVENTION

Accordingly, it is an object of the present invention to provide an apparatus for efficiently transferring disks such as modern semiconductor wafers with a relatively small central hole between a cassette of an ordinary prior art type and a pallet of a common type described above.

An apparatus with which the above and other objects can be accomplished may be characterized as having two transversely notched horizontal rods which are supported such that they are parallel to each other and one is positioned above the other. Not only can both of these rods be controllably and individually moved in the longitudinal direction but the upper rod can be moved up and down vertically such that the vertical separation between the two rods can be controllably varied. The lower rod is sufficiently slender and can be passed through the central holes of the disks. The notches on both rods are at the same pitch as the disks on the cassette, and those on the lower rod are facing upwards, while those on the upper rod are facing downwards, such that the disks can be individually hung from the notches in the lower rod which pass through their central holes and the upper rod can be adjusted to hold their top edges in its notches. The apparatus of this invention is itself intended to be three-dimensionally transported (say, between the positions of a loaded cassette and a pallet) by robot means with its motion controlled by a central processing unit according to a stored program.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a perspective view of an apparatus embodying the invention;

FIGS. 2A-2C are a series of schematic sectional side views of a portion of the apparatus of FIG. 1 including the two rods to show the sequence by which the apparatus is used to transfer disks from a cassette of a conventional type onto itself;

FIG. 3 is a perspective view of the apparatus of FIG. 1 when it is fully loaded with disks;

FIGS. 4A-4C are a series of schematic sectional side views like FIGS. 2A-2C showing the sequence by which a fully loaded apparatus shown in FIG. 3 may transfer one of its disks to a pallet;

FIG. 5 is a perspective view of the apparatus of FIG. 1 after 11 of the 25 disks originally loaded thereto have been unloaded, the twelfth disk being ready to be unloaded next;

FIG. 6 is a schematic sectional side view of a distal end portion of the upper rod of the apparatus shown in FIGS. 1-5, showing the sensor disposed thereat for detecting the presence or absence of a disk at a corresponding position;

FIGS. 7A-7F are a series of schematic sectional side views like FIGS. 2A-2C showing the sequence by which the first two of a plurality of disks are picked up from a pallet onto the apparatus shown in FIG. 1 when it is completely unloaded; and FIG. 8 is a schematic block diagram of a control system for the apparatus of FIG. 1.

In all these drawings, corresponding components are indicated by the same numerals, except the numerals assigned to the disks are not necessarily the same when they are being unloaded from the apparatus and when they are being picked up.

DETAILED DESCRIPTION OF THE INVENTION

As shown in FIG. 1, an apparatus 10 according to the present invention is characterized as having two notched rods (herein referred to respectively as the lower rod 12 and the upper rod 14), longitudinally fastened respectively to a lower shaft 16 and an upper shaft 18, which are both supported horizontally by a driving unit (not shown) inside a housing structure 20 such that the two rods 12 and 14 remain parallel to each other and the upper rod 14 is vertically above the lower rod 12. The driving unit includes three servo motors (shown only schematically at 40, 42 and 44 in FIG. 8, but not in FIG. 1), two of them being adapted to individually move the two shafts 16 and 18 longitudinally and the third being adapted to move the upper shaft 18 vertically. This means that the two rods 12 and 14 stay parallel to each other and the upper rod 14 is always vertically above the lower rod 12 under the operations of these servo motors, although the vertical separation between the rods 12 and 14 can be varied.

The lower rod 12 is notched transversely and horizontally at a uniform pitch on its upper surface. The upper rod 14 is similarly notched transversely and horizontally at the same pitch on its lower surface. In other words, the two notched surfaces of the rods 12 and 14 are opposite to each other. Although FIG. 1 shows the two notched rods 12 and 14 in an exactly face-to-face relationship, their relative longitudinal position can be varied. The pitch and the number of the notches on the rods 12 and 14 are to match those of disks which may be carried on a cassette of a conventional type referred to above, and may typically be 0.25 inches and 25.

The housing structure 20 is supported as a whole by a robot arm 22 such that it can be moved in all directions and its orientation can be freely changed, although the housing structure 20 is not intended to be thereby tilted for the purpose of use according to the present invention, as will be described below.

In order to transfer disks from a cassette to a pallet, the disks are initially transferred onto the apparatus 10 all at once and then transferred one at a time to the individual openings of the pallet. Throughout herein, the cassette and the pallet will be assumed to be of conventional kinds described above, and the process of picking up disks from such a cassette will be explained first with reference to FIGS. 2A-2C. For convenience, it will be assumed that the cassette (indicated generally by numeral 25) is fully loaded with 25 disks, which will be indicated summarily by numeral 30 and individually by numerals 30-1, 30-2, . . . , 30-25 in the order of their positions on the cassette 25. All the drawings herein for showing a sequence of operations are intended to be interpreted as being schematic and only for the purpose of showing the steps to be taken in the operation. The sectional shapes and dimensional relationships of the notches as shown, for example, are not intended to be representative of a preferred embodiment of the invention.

To start, the robot arm 22 is so operated as to position the apparatus 10 as shown in FIG. 2A such that the lower rod 12 is aligned with the holes of the disks 30 on the cassette 25. The shafts 16 and 18, to which the rods 12 and 14 are individually attached, are fully retracted into the housing structure 20, as shown in FIG. 1. The vertical separation between the two rods 12 and 14 is increased to be greater than the radius of the disks 30. Thereafter, the shafts 16 and 18 are longitudinally extended out from the housing structure 20, as shown by arrows in FIG. 2A. Since the notches on the rods 12 and 14 have the same pitch as the disks 30 on the cassette 25 and there are understood to be equal numbers of them, the rods 12 and 14 can be extended such that the notches thereon match individually with the disks 30 on the cassette 25 as shown in FIG. 2B. To make this possible, the driving unit inside the housing structure 20 and the shafts 16 and 18 are designed such that the rods 12 and 14 can be longitudinally moved at least by distances equal to the lengths of their notched portions. If the cassette is designed to carry 25 disks at intervals of 0.25 inches each, this means that the total longitudinal distances by which the rods 12 and 14 should be able to move are about 6.25 inches.

After the rods 12 and 14 are so positioned as to be longitudinally aligned with the individual disks 30 on the cassette 25 as shown in FIG. 2B, the housing structure 20 is raised as shown by an upwardly pointing arrow therein such that the disks 30 fall in the individual notches on the lower rod 12 and to be raised thereby. Either thereafter or concurrently therewith, the upper rod 14 is lowered with respect to the housing structure 20, as shown by a downwardly pointing arrow in FIG. 2B, until the disks 30 are securely held between the rods 12 and 14 as shown in FIG. 2C. The disks 30 are now lifted and separated from the cassette 25, and the robot arm 22 can be controlled to transport the disks 30 to the position of a pallet. FIG. 3 shows the apparatus 10 when it is thus fully loaded with the disks 30.

A sequence of operations for depositing a disk in one of the holes in a pallet (indicated by numeral 35) from the fully loaded apparatus 10 as shown in FIGS. 2C and 3 will be explained next with reference to FIGS. 4A-4C. After the robot arm 22 transports the fully loaded apparatus to the front of the pallet 35 such that the lower rod 12 is aligned with the center of the particular one of the holes in the pallet 35 wherein one of the disks 30 is to be deposited, the driving unit is so operated as to lift the upper rod 14, to retract it longitudinally by one notch and to lower it again, such that the net effect would be to have the first of the loaded disks (30-1) no longer held from above by the upper rod 14, although the remainders of the disks (30-2 through 30-25) on the lower rod 12 are again held securely from above by the upper rod 14. This motion of the upper rod 12 described above is indicated by a twice-bent arrow in FIG. 4A.

The shafts 16 and 18, and hence both of the rods 12 and 14, are thereafter extended longitudinally together as shown by arrows in FIG. 4B such that the first disk 30-1, which is no longer held by the upper rod 14 from above, comes to be within the hole. The housing structure 20 is subsequently lowered, as shown by a vertical arrow in FIG. 4C such that the first disk 30-1 is deposited within the hole and received in a groove (or grooves, depending on the design of the pallet) at its bottom, being separated from the lower rod 12, while the other disks 30-2 through 30-25 stay on the lower rod 12, being held from above by the upper rod 14. After the housing structure 20 is thus lowered and the lower rod 12 is completely disengaged from the first disk 30-1 as shown in FIG. 4C, the apparatus 10 is moved away from the pallet 35.

This sequence is repeated for the deposition of the rest of the disks 30-2 through 30-25. For depositing the next disk in another hole, for example, the lower rod 12 is aligned to the selected hole, the upper rod 14 is shifted one notch back towards the housing structure 20 so as to disengage the next disk now at the front of the remaining disks, push the rods 12 and 14 forward together so as to place this front disk in the hole, lower the rods 12 and 14 together to disengage the front disk, and withdraw the rods 12 and 14. FIG. 5 shows the apparatus 10 after eleven of the 25 originally loaded disks thereon have been thus unloaded, having the 14 remaining disks 30 still supported between the rods 12 and 14 with the twelfth disk 30-12 ready to be deposited next.

If the cassette 25 is not fully loaded with disks when the apparatus 10 is used to pick them up therefrom as described above with reference to FIGS. 2A-2C, some of the notches on the lower rod 12 will remain unoccupied. If the sequence of loading operations explained above by way of FIGS. 4A-4C is carried out exactly as described when the apparatus 10 is actually not fully loaded, some of the holes in the pallet 35 will fail to receive a disk. Suppose, for example, that the first notch on the lower rod 12 is occupied but not the second. (For the convenience of referencing, the notches on the rods 12 and 14 will hereafter be counted from their distal ends, respectively, away from the housing structure 20.) After the first disk 30-1 is deposited in a first preselected hole, the upper rod 14 is retracted by one notch such that the first notch on the upper rod 14 will be holding the disk in the third notch on the lower rod 12. If the apparatus 10 is transported so as to have the lower rod 12 aligned with a second preselected hole and the process described in connection with FIGS. 4B and 4C is carried out, there is no disk to be disengaged from the second notch and to be transferred to this hole.

In order to avoid situations like this and to make use of every available hole in a pallet, the top rod 14 is provided with a sensor (shown at 24 in FIG. 6) for detecting the presence or absence of a disk at the position of the first notch thereon. If the sensor 24 detects no disk at the second notch on the lower rod 12 as shown in FIG. 6 (unlike the situation depicted in FIG. 4A), the upper rod 14 is retracted not by just one notch as shown by the arrow in FIG. 4A but further backward as shown by an arrow in FIG. 6 until a disk is detected below the detector 24. In the situation depicted in FIG. 6, there is a disk (30-3) present at the third notch on the lower rod 12. The upper rod 14 is retracted only by one extra notch and then lowered such that its first notch will hold the disk (30-3) in the third notch on the lower rod 12. For convenience, the sensor 46 is not shown in the other drawings, which are primarily for explaining the loading and unloading sequences.

Next, FIGS. 7A–7F will be referenced to explain the procedure by which the apparatus 10, when it is completely unloaded as shown in FIG. 1, is used to pick up disks 30 from different holes of a pallet. Firstly, the robot arm 22 brings the fully unloaded apparatus 10 to the front of the hole from which the first disk is to be picked up. (For convenience, the nth disk to be picked up will be indicated hereafter by 30-n where n=1, ... 25 although the nth disk to be picked up need not be the nth disk to have been earlier deposited onto the pallet.) The lower rod 12 is aligned with the central hole of the disk 30-1. The upper rod 14 is at a raised position and is fully retracted towards the housing structure 20. The lower shaft 16, supporting the lower rod 12, is then fully extended out of the housing structure 20, as shown by an arrow in FIG. 7A, such that the 25th notch on the lower rod 12 falls inside the central hole of the disk 30-1. With the lower rod 12 thus positioned longitudinally, the apparatus 10 is raised slightly as shown by an arrow in FIG. 7B such that the disk 30-1 is lifted by its inner periphery abutting its central hole and out of the groove at the bottom of the hole. Next, the apparatus 10 is retracted horizontally, as shown by a horizontal arrow in FIG. 7C, away from the pallet 35 to carry the disk 30-1 out of the hole, and the upper shaft 18 is advanced and lowered, as shown by a bent arrow in FIG. 7C, such that the disk 30-1 is securely held between the 25th notch of the lower rod 12 and the first notch of the upper rod 14 while the robot arm 22 moves the apparatus 10 to the front of the next selected hole to pick up a second disk.

The second disk is picked up similarly, except the apparatus 10 is already supporting a disk between the 25th notch of its lower rod 12 and the first notch of the upper rod 14. The second disk is going to rest in the 24th notch of the lower rod 12 with its top edge held within the first notch of the upper rod 14, when it is finally picked up and the apparatus 10 moves to the position of a third disk to be picked up. So, the apparatus 10 is positioned in front of the next hole from which the second disk is to be picked up and the lower rod 12 is aligned with its central hole, but the apparatus 10 is advanced only to the extent that the 24th notch on the lower rod 12 is aligned with the hole of the disk to be picked up, as shown in FIG. 7D. After the apparatus 10 is lifted slightly to disengage the disk 30-2 from the groove at the bottom of the hole and is retracted horizontally, as shown by a bent arrow in FIG. 7E, to extract the disk 30-2 out of the hole, the upper shaft 18 is raised, advanced by one notch and lowered again, as shown by a twice-bent arrow in FIG. 7F, such that the two disks, which have been picked up, have their top edges within the first and second notches of the upper rod 14. The process described above is repeated such that the nth disk 30-n to be picked up (n=1, ... 25) will rest in the (26-n)th notch on the lower rod 12, having its top edge secured in the nth notch of the upper rod 14.

The operations described above for transferring disks between a cassette and a pallet are carried out automatically according to a program. As schematically shown in FIG. 8, a control system 50 for these operations, inclusive of the motion of the housing structure 20 by the robot arm 22, includes a central processing unit (CPU) 52. As briefly mentioned above, the housing structure 20 includes two servo motors 40 and 42 for controlling the longitudinal motions respectively of the lower rod 12 and the upper rod 14, and a third servo motor 44 for controlling the vertical motion of the upper rod 14 with respect to the housing structure 20. The operations of these three servo motors 40, 42 and 44, as well as the motion of the robot arm 22 are controlled by the CPU 52 according to a program stored in a memory device 54 and also an output from the sensor 24, as explained above. In FIG. 8, numeral 56 indicates an input device through which a user can specify particular modes of operation or modify the pre-stored program.

The present invention has been described above by way of only one example, but this example is to be interpreted as illustrative, and not limitative. For example, although the upper and lower rods 12 and 14 were described above as if they were notched themselves, it is preferable to provide notched pieces made, say, of a lennit or nylon resin material and removably attached to the rods 12 and 14, say, by faucet joints or pins. In this manner, the same apparatus can be used to serve disks from cassettes having different pitches.

Regarding the drawings, it is to be noted that they are intended to show the basic structure of the apparatus embodying the invention and the basic principles of its operations. They are not intended to accurately depict preferred shapes or positional relationships of various components. In FIGS. 1, 3 and 5, numerals 46 indicate arm-like members for grabbing edges of a cassette, but other convenient components such as a sensor for detecting the position of a hole in a pallet may be provided to the housing structure. In summary, many such modifications and variations that may be apparent to a person skilled in the art are intended to be included within the scope of the invention and the disclosure herein is intended to be interpreted broadly.

What is claimed is:

1. An apparatus for sequentially transferring disks with central holes between a cassette and a pallet, said cassette being adapted to hold disks vertically and parallel to one another at a uniform pitch with their central holes aligned, and said pallet having a vertical surface with openings and being adapted to vertically support one of said disks at each of the said openings with both surfaces of said disks substantially entirely exposed, said apparatus comprising:

an elongated lower rod capable of passing through said central holes and having upwardly facing notches transversely formed at said pitch for individually receiving said disks, an elongated upper rod which has downwardly facing notches transversely formed at said pitch, supporting means for supporting said lower and upper rods horizontally and mutually parallel to each other such that said upper rod is vertically above said lower rod, first and second servo motor means for longitudinally moving said lower and upper rods, respectively, third servo motor means for varying vertical separation between said lower and upper rods, and control means for individually controlling said first, second and third servo motor means.

2. The apparatus of claim 1 further comprising a sensor for detecting the presence of a disk, said sensor being attached near an end of said upper rod distal from said supporting means.

3. The apparatus of claim 1 wherein said upper and lower rods are longitudinally movable by at least the length of their notched portion with respect to said supporting means.

4. The apparatus of claim 1 wherein said lower rod is affixed to said supporting means and said third servo motor means serves to move said upper rod vertically.

* * * * *